(12) United States Patent
Kim et al.

(10) Patent No.: US 10,461,391 B2
(45) Date of Patent: Oct. 29, 2019

(54) EXPANDED WAVEGUIDE INCLUDING MULTILATERAL PILLARS FORMING MULTIPLE CHANNELS THEREIN

(71) Applicant: KOREA UNIVERSITY RESEARCH AND BUSINESS FOUNDATION, Seoul (KR)

(72) Inventors: Moon Il Kim, Seongnam-si (KR); Chang Hwan Yi, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 0 days.

(21) Appl. No.: 15/696,980

(22) Filed: Sep. 6, 2017

(65) Prior Publication Data
US 2018/0331410 A1    Nov. 15, 2018

(30) Foreign Application Priority Data

May 10, 2017    (KR) .......................... 10-2017-0057977

(51) Int. Cl.
| | |
|---|---|
| *H01P 5/12* | (2006.01) |
| *H01P 3/123* | (2006.01) |
| *H03F 3/68* | (2006.01) |
| *H01P 5/02* | (2006.01) |
| *H01P 5/00* | (2006.01) |

(52) U.S. Cl.
CPC ................ *H01P 5/12* (2013.01); *H01P 3/123* (2013.01); *H01P 5/024* (2013.01); *H03F 3/68* (2013.01); *H01P 5/00* (2013.01)

(58) Field of Classification Search
CPC ................ H01P 5/12; H03H 3/68; H03F 3/68
USPC .................................. 333/125, 137; 330/295
See application file for complete search history.

(56) References Cited

U.S. PATENT DOCUMENTS

| | | | | |
|---|---|---|---|---|
| 3,218,580 A | * | 11/1965 | Zanichkowsky | ......... H01P 5/12 333/125 |
| 3,564,458 A | * | 2/1971 | Cumming | ................. H01P 1/16 219/695 |
| 4,291,278 A | * | 9/1981 | Quine | ..................... H03F 3/604 330/286 |
| 4,588,962 A | * | 5/1986 | Saito et al. | ............... H01P 5/12 330/286 |

* cited by examiner

*Primary Examiner* — Benny T Lee
(74) *Attorney, Agent, or Firm* — Hauptman Ham, LLP

(57) ABSTRACT

An expanded waveguide for providing uniform electromagnetic field is disclosed. The expanded waveguide comprises an expanded area expanded in the direction of the E-plane, an input transition area and an output transition area connected to both sides of the expanded area and configured to pass an electromagnetic wave, and entrance parts formed respectively to an end part of the input transition area and an end part of the output transition area, the electromagnetic wave being inputted and outputted through the entrance parts. Here, a plurality of multilateral pillars are arranged in constant space in the transition areas, and a channel is formed along between the multilateral pillars.

9 Claims, 13 Drawing Sheets

FIG. 14
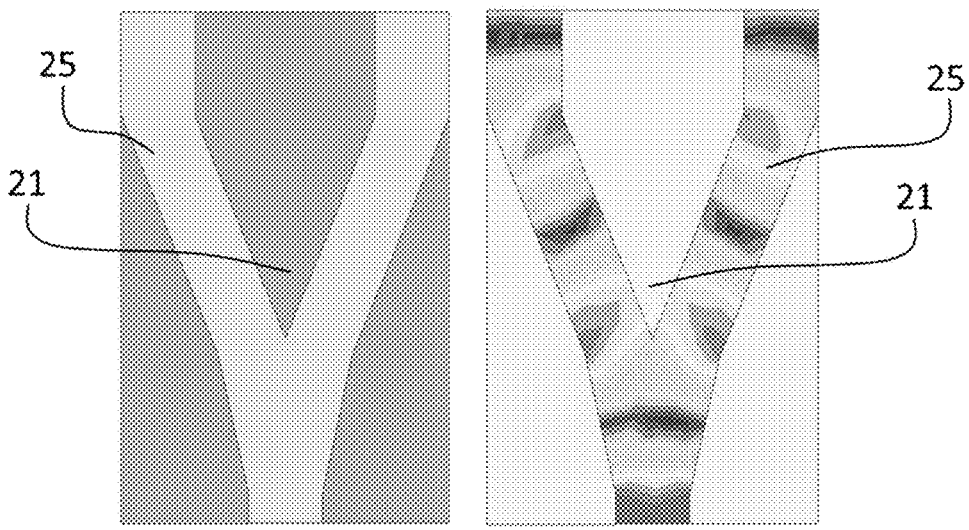
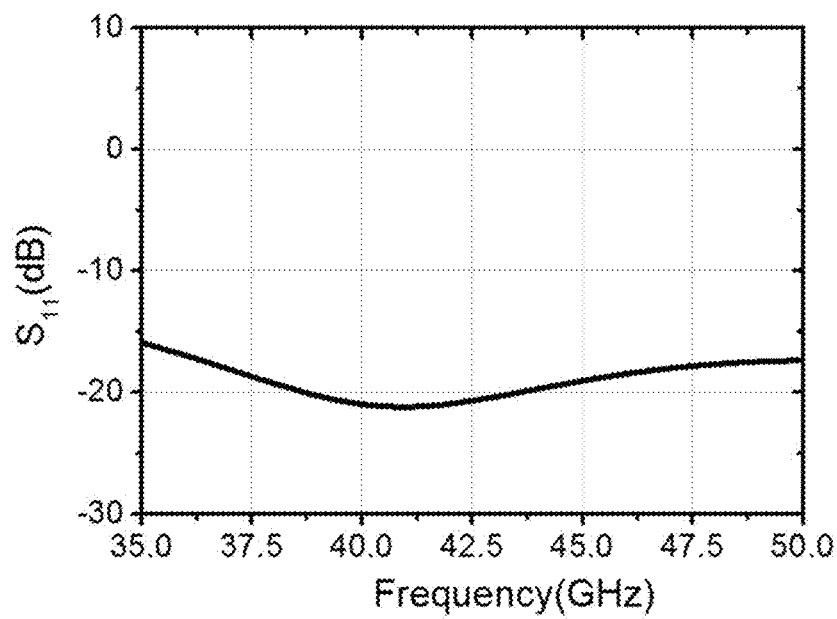

FIG. 17
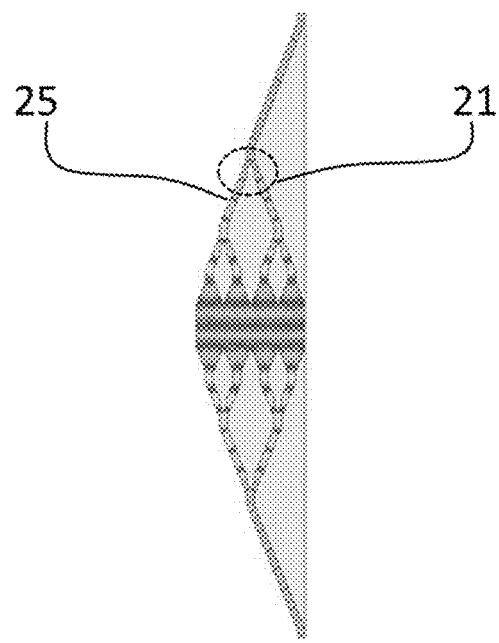
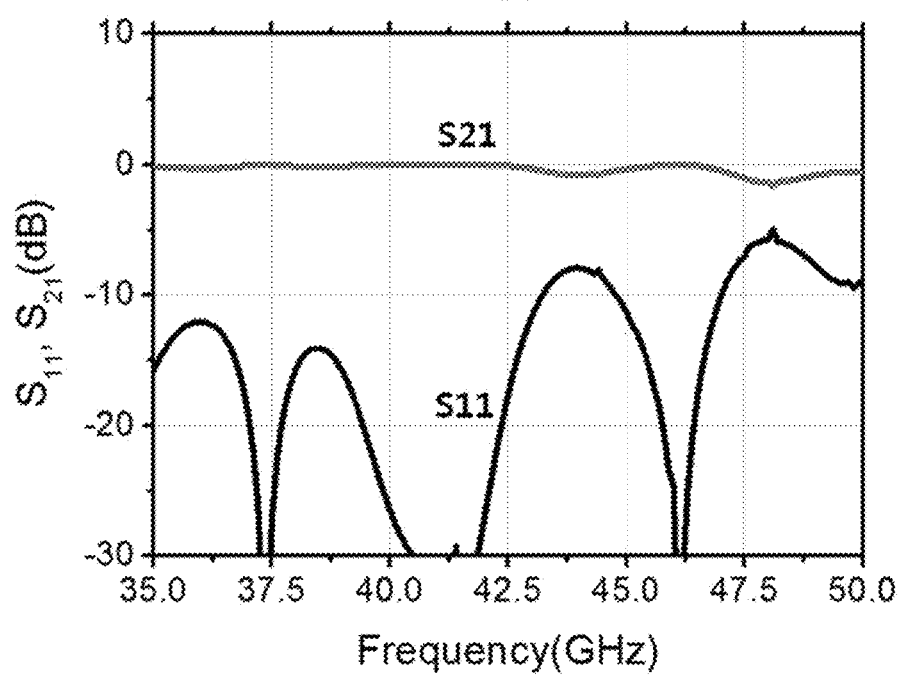

EXPANDED WAVEGUIDE INCLUDING MULTILATERAL PILLARS FORMING MULTIPLE CHANNELS THEREIN

PRIORITY

This application claims priority under 35 U.S.C. § 119(a) to a Korean patent application filed on May 10, 2017 in the Korean Intellectual Property Office and assigned Serial No. 10-2017-0057977, the entire disclosure of which is incorporated herein by reference.

BACKGROUND

1. Field of the Invention

The present disclosure relates to an expanded waveguide, and more particularly relates to an expanded waveguide for providing uniform electromagnetic field to perform packaging of a spatial power combination component.

2. Description of the Related Art

Generally, power capacity of individual semiconductor circuit is very limited. As a result, a number of combinable circuits are less due to loss of a distribution circuit, in the event that a metal conductive line is used as a transmission line to obtain high output. To overcome the problem, a spatial power combination technique, for providing an input wave and an output wave to a space by adhering an antenna to individual semiconductor circuit (Cell), was developed.

An input/output electromagnetic field of the individual semiconductor circuit keeps a uniform value in the event that a spatial power combining is performed in an open space, but it is not practical because external emission loss is high. Thus, it is necessary to perform packaging of a semiconductor array in a space blocked by a metal.

In a low frequency waveguide developed up to date, size of a semiconductor array installed in the waveguide is not large compared with size of the waveguide. However, the size of the waveguide becomes very small as the frequency of a recent radar communication component increases. Therefore, the size of the waveguide should be increased in order to install the semiconductor array. That is, an expanded waveguide is required. Since multiple modes are generated in an internal space blocked by a metal in the expanded waveguide, a technique for providing input/output waves having uniform intensity has been required.

A packaging technique needed for the spatial power combining is very important because a frequency band more than W-band has been rapidly developed and it is necessary to develop a high power electromagnetic component. A housing or packaging technique for the spatial power combining is not set up in a frequency band more than 70 GHz (W-band) at present.

FIG. 1 is a view illustrating a one dimensional expanded waveguide according to the related art.

The one dimensional expanded waveguide shown in FIG. 1 is presently suggested by Chalmers University of Technology. One dimensional semiconductor array is used instead of the conventional two dimensional spatial power combining in a metal packaging environment. Semiconductor chips are combined in a high frequency of W-band. It is possible that the one dimensional waveguide uses a metal in order to prevent overheat of the semiconductor chip.

However, the problem exists in that a power distributed in the semiconductor array is not uniform because the one dimensional expanded waveguide depends on an electromagnetic radiation to which the metal packaging is not properly applied.

Additionally, an H-plane cut for cutting in a left-right direction not an up-down direction is used when an expanded waveguide block is manufactured, and so it is complicated and loss occurs. It is inconvenient to install each semiconductor chip individually in order to form the semiconductor array in the expanded waveguide.

Accordingly, the expanded waveguide has been required to keep uniform intensity distribution of an electromagnetic wave in a frequency band more than W-band.

SUMMARY OF THE INVENTION

The invention has been made to address at least the disadvantages and problems described above, and to provide at least the advantages described below. An aspect of the invention provides an expanded waveguide for expanding the inside of a standard waveguide to secure a space for installing semiconductor elements on the same plane in a one dimensional array, and providing uniform electromagnetic field in a frequency band more than W-band.

According to one embodiment of the invention, an expanded waveguide expanded in a direction of an E-plane to provide uniform electromagnetic field comprises an expanded area expanded in the direction of the E-plane; an input transition area and an output transition area connected to both sides of the expanded area and configured to pass an electromagnetic wave; and entrance parts formed respectively to an end part of the input transition area and an end part of the output transition area, the electromagnetic wave being inputted and outputted through the entrance parts. Here, a plurality of multilateral pillars are arranged in constant space in the transition areas, and a channel is formed along between the multilateral pillars.

The channel is divided into two paths in a preset level to form a binary tree and the division of the paths begins from a path at an entrance part of the channel. Here, every path from an inlet of the channel corresponding to the entrance part to an outlet of the channel corresponding to the expanded area has the same length.

The electromagnetic wave inputted through the entrance part passes every path, and thus the electromagnetic wave is divided into plural electromagnetic waves, and an arrival time of every electromagnetic wave at each of the entrance parts is the same.

The multilateral pillar is a rectangular pillar having a cross section of a rhombus shape. Here, the rectangular pillars having the cross section of the rhombus shape are arranged with different size so that the channel is formed in the three in the transition area.

The multilateral pillar is a hexagonal pillar having hexagonal cross section formed by cutting a pair of facing edge parts in the rhombus shape to form bilateral symmetry A width of the transition area reduces in the direction from the expanded area to the entrance part, depending on width difference between the expanded area and the entrance part.

The transition area has a triangular cross section in the direction of the E-plane. Here, the entrance part is formed at one vertex of a triangle, and a line segment of the triangle corresponding to the vertex is connected to the expanded area.

Semiconductor elements are installed in the one dimensional array in the expanded area.

Amplifier elements are installed in the one dimensional array in the expanded area to form an amplifier array, and thus one dimensional spatial power combining amplifier is formed.

A width of the channel has a length smaller than half wavelength (λ/2).

A bent degree of the channel is an angle smaller than 30°.

A space of an outlet of the channel is smaller than one wavelength.

An edge part of the multilateral pillar located on a division part of the channel has an arrowhead structure.

An inlet before division of the channel has a step structure.

An inlet before division of the channel has a taper structure.

An expanded waveguide of the invention may secure a space for installing semiconductor elements on the same plane in one dimensional array and provide uniform electromagnetic field in a frequency band more than W-band.

Furthermore, the expanded waveguide may be necessarily applied to a device for an electromagnetic input/output combination which generates a high output electromagnetic wave needed for electromagnetic wave related hardware such as a long distance radar and a communication device.

BRIEF DESCRIPTION OF DRAWINGS

The aspects, features, advantages and embodiments of the invention will be more apparent from the following detailed description taken in conjunction with reference to the accompanying drawings, in which:

FIG. 7 to FIG. 17 are views illustrating a design of an expanded waveguide and an experimental graph of a waveguide of the design of expanded waveguide, respectively, according to another embodiment of the invention.

DETAILED DESCRIPTION OF THE INVENTION

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements or operations may be further included. Also, terms such as "unit," "module," etc., as used in the present specification may refer to a part for processing at least one function or action and may be implemented as hardware, software, or a combination of hardware and software.

Hereinafter, embodiments of the invention will be described in detail with reference to accompanying drawings.

Figure 1:
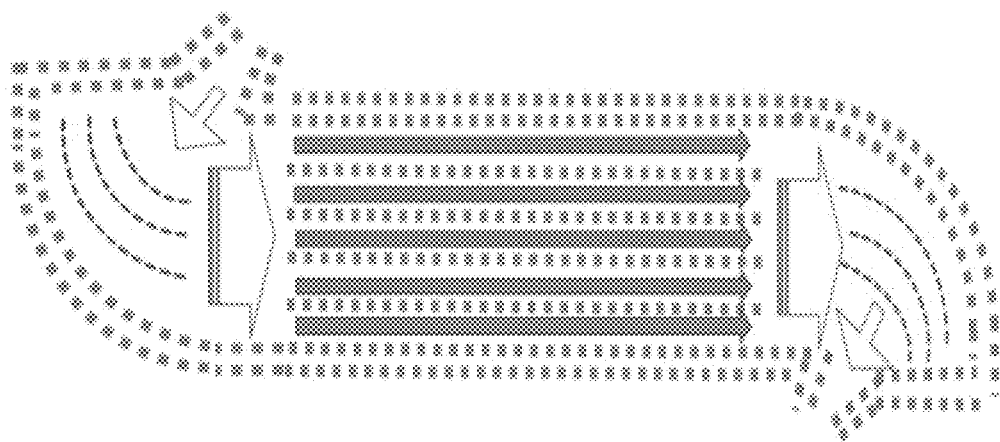
FIG. 1 is a view illustrating one dimensional expanded waveguide according to the related art.
Figure 2:
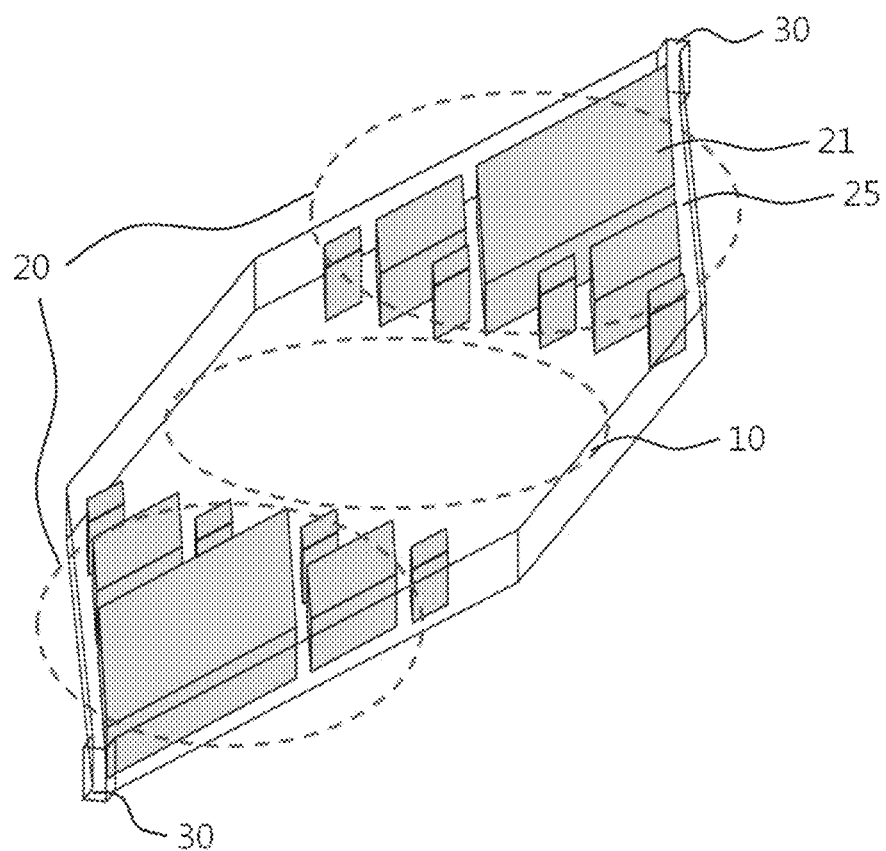
FIG. 2 and FIG. 3 are a perspective view and a plane view, respectively, illustrating an inside and an outside of an expanded waveguide according to one embodiment of the invention.
Figure 3:
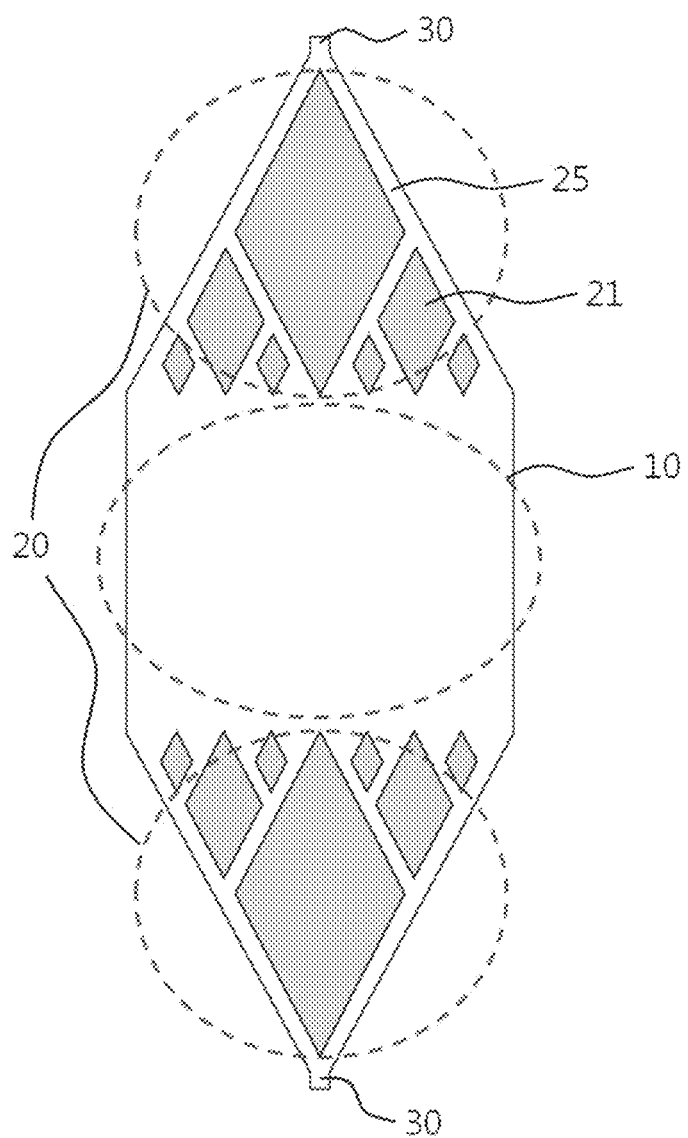
Figure 4A:
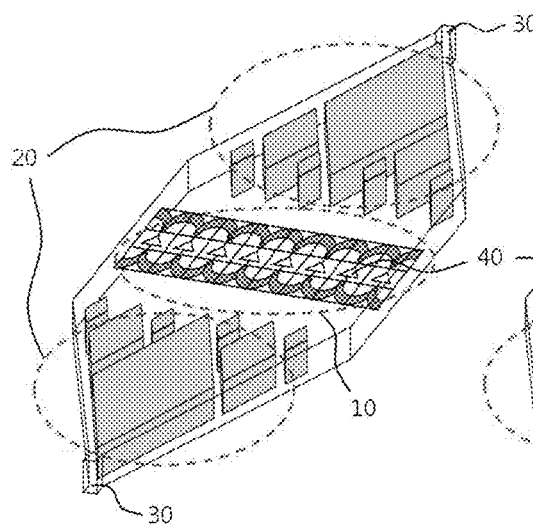
FIGS. 4(a) and 4(b) are views illustrating an application example of an expanded waveguide according to one embodiment of the invention.
Figure 4B:
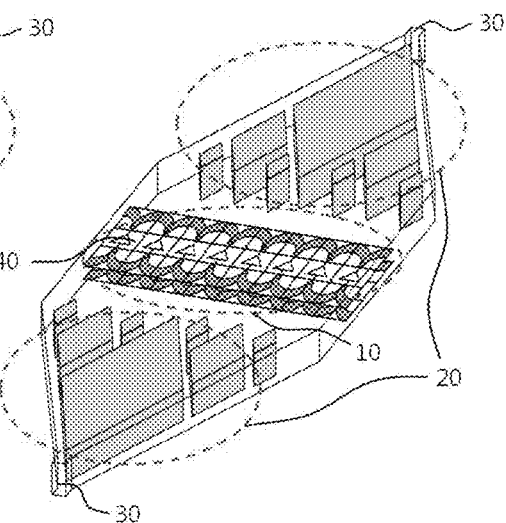
Figure 5:
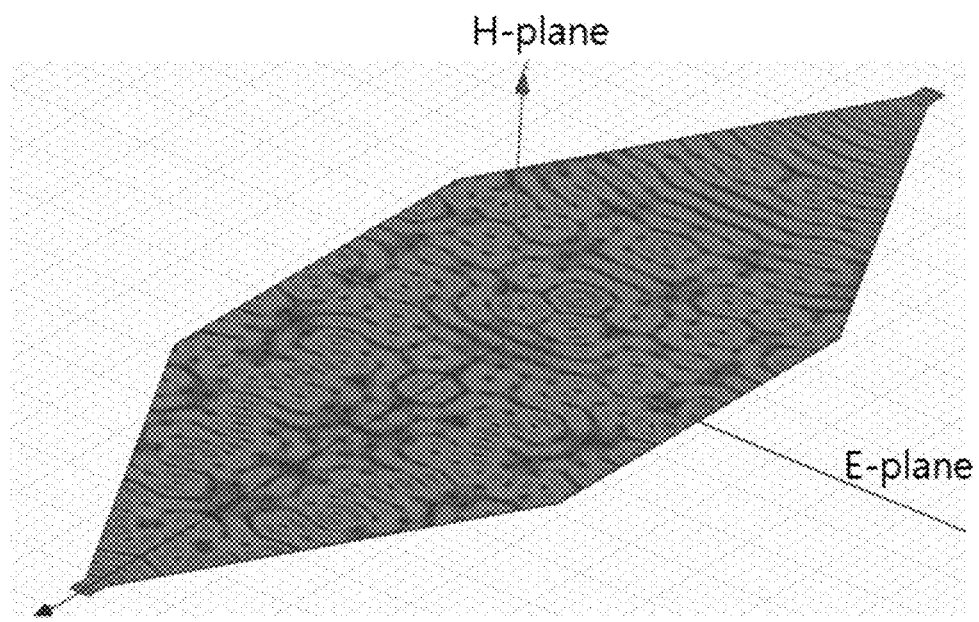
FIG. 5 is a view illustrating a simple electromagnetic distribution according to one embodiment of the invention.
Figure 6:
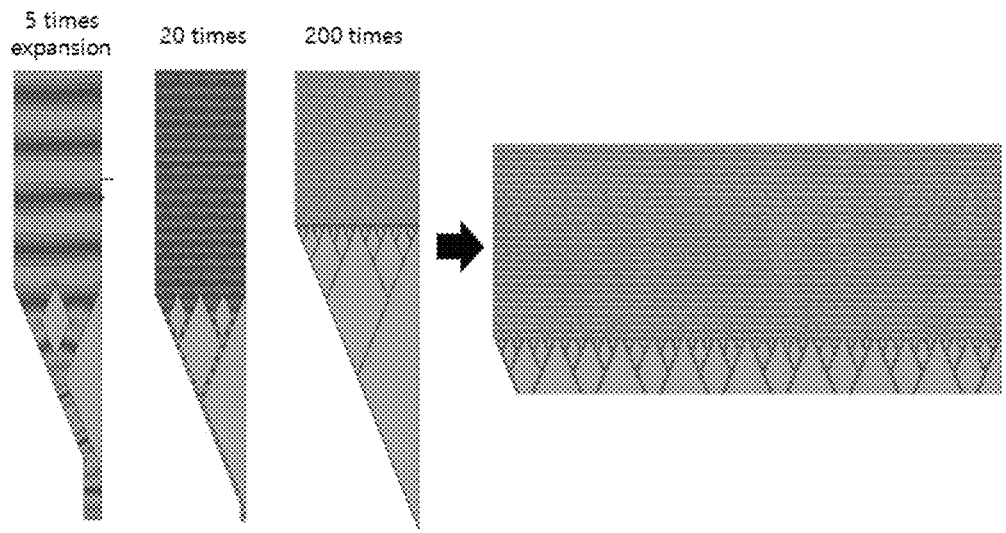
FIG. 6 is view illustrating a channel formed in the expanded waveguide according to one embodiment of the invention.

FIG. 2 and FIG. 3 are a perspective view and a plane view illustrating an inside and an outside of an expanded waveguide according to one embodiment of the invention. FIGS. 4(a) and 4(b) are views illustrating an application example of an expanded waveguide according to one embodiment of the invention, and FIG. 5 is a view illustrating a simple electromagnetic distribution according to one embodiment of the invention. FIG. 6 is view illustrating a channel formed in the expanded waveguide according to one embodiment of the invention. Hereinafter, the expanded waveguide of the invention will be described based on drawings FIG. 2 and FIG. 3, with reference to drawings FIG. 4 to FIG. 6.

In FIG. 2 and FIG. 3, the expanded waveguide of the present embodiment includes an expanded area 10, a transition area 20 and an entrance part 30.

Particularly, in the expanded waveguide of the invention, the expanded area 10, where semiconductor elements are installed in a one dimensional array, is formed in middle position of the expanded waveguide, and input transition and output transition areas 20 through which inputted electromagnetic wave passes are connected to both sides of the expanded area 10. The entrance parts 30 through which an electromagnetic wave is inputted or outputted are formed at each of end parts of the input transition and output transition areas 20.

For example, FIG. 4(a) and FIG. 4(b) show an one dimensional spatial power combining array amplifier using the expanded waveguide according to embodiments of the invention. As shown in FIG. 4(a) and FIG. 4(b), amplifier elements having an antenna structure as a semiconductor element may be formed in one dimensional array in the middle of the expanded area 10, thereby forming an amplifier array 40. The entrance parts 30 through which the electromagnetic wave is inputted or outputted are formed at each of end parts of the input transition and output transition areas 20. Moreover, one amplifier array 40 may be formed in middle position of the expanded area 10, as shown in FIG. 4(a), or two amplifier arrays 40 may be formed in an up-down direction in middle position of the expanded area 10, as shown in FIG. 4(b).

As shown in FIG. 5, the expanded waveguide of the invention has a shape expanded in a direction of an E-plane on which an E field lies on its side, to obtain uniform electromagnetic field distribution.

If a one dimensional metal waveguide is randomly expanded, various modes occur, and thus it is difficult to provide a plane wave. If an H-plane vertical to the E-plane is used, the E field parallel to a left metal wall and a right metal wall of a metal waveguide disappears, and thus uniform electromagnetic field distribution cannot be achieved.

FIG. 6 is view illustrating channels having 5 times expansion, 20 time expansion, and 200 times expansion, according to one embodiment of the invention.

Now referring to FIG. 2 and FIG. 3, the expanded area 10 indicates an area of the waveguide expanded in the direction of the E-plane. For example, the expanded area 10 may have a rectangular cross section in the direction of the E-plane.

A size of the transition area 20 reduces in a direction from the expanded area 10 to the entrance part 30, depending on size difference (i.e. horizontal width) of the expanded area 10 and the entrance part 30. That is, the horizontal width of the transition area 20 may reduce in the direction from the expanded area 10 to the entrance part 30. For example, the transition area 20 may have a triangular cross section in the direction of the E-plane. The entrance part 30 may be formed at one vertex of a triangle, and a line segment of the triangle corresponding to the vertex may be connected to the expanded area 10.

Specifically, plural multilateral pillars 21 are arranged in constant space in the transition area 20, to realize uniform electromagnetic field distribution. As a result, a channel 25 is formed along between the multilateral pillars 21.

Here, the channel 25 may be formed in a tree where each of paths is divided into two paths in a preset level, and the division of the paths begins from a path at the entrance part 30. Here, every path from an inlet of the channel 25 corresponding to the entrance part 30 to an outlet of the channel 25 corresponding to the expanded area 10 may have the same length. As a result, an electromagnetic wave inputted through the entrance part 30 passes every path from the inlet of the channel 25 corresponding to the entrance part 30 to the outlet of the channel 25 corresponding to the expanded area 10, and thus the electromagnetic wave is divided into plural electromagnetic waves. An arrival time of every divided electromagnetic wave at each of the outlets of the channel 25 may be the same.

For example, as shown in FIG. 2 and FIG. 3, the multilateral pillar 21 may be a rectangular pillar, and the cross section thereof may have a rhombus shape. To form the channel 25 in the tree where each of the paths is divided into two paths in a preset level in the transition area 20, plural multilateral pillars 21 having rhombus shape may be arranged with different size. Furthermore, if the level increases as shown in FIG. 6, a number of paths in the channel 25 may be expanded.

If the channel 25 is formed in the tree so that every path to each of the outlets of the channel 25 has the same length, the multilateral pillar 21 may be a hexagonal pillar. That is, the multilateral pillar 21 may be the hexagonal pillar having hexagonal cross section formed by cutting a pair of facing edge parts in the rhombus to form bilateral symmetry.

A variety of multilateral pillars 21 including the rectangular pillar or the hexagonal pillar may be formed by the method of cutting the edge parts.

Hereinafter, an expanded waveguide according to another embodiment of the invention will be described in detail with reference to accompanying drawings FIG. 7 to FIG. 17.

FIG. 7 to FIG. 17 are views illustrating detailed design of an expanded waveguide according to another embodiment of the invention.

The detailed design of the expanded waveguide may be performed about a width of the channel 25, bent degree of the channel 25, a space of an outlet of the channel 25, a structure of a division part of the channel 25 and a structure of an inlet before division in the channel 25.

In FIGS. 7-17, it is assumed that the expanded waveguide is a Q-band waveguide of 33-50 GHz (Frequency), a center frequency is 42.5 GHz, a wavelength ($\lambda$) is 7 mm, the width of the waveguide is 5.7 mm, and a height of the waveguide is 2.8 mm. Firstly, design for the width of the channel 25 will be described with reference to FIG. 7 and FIG. 8.

Figure 7:
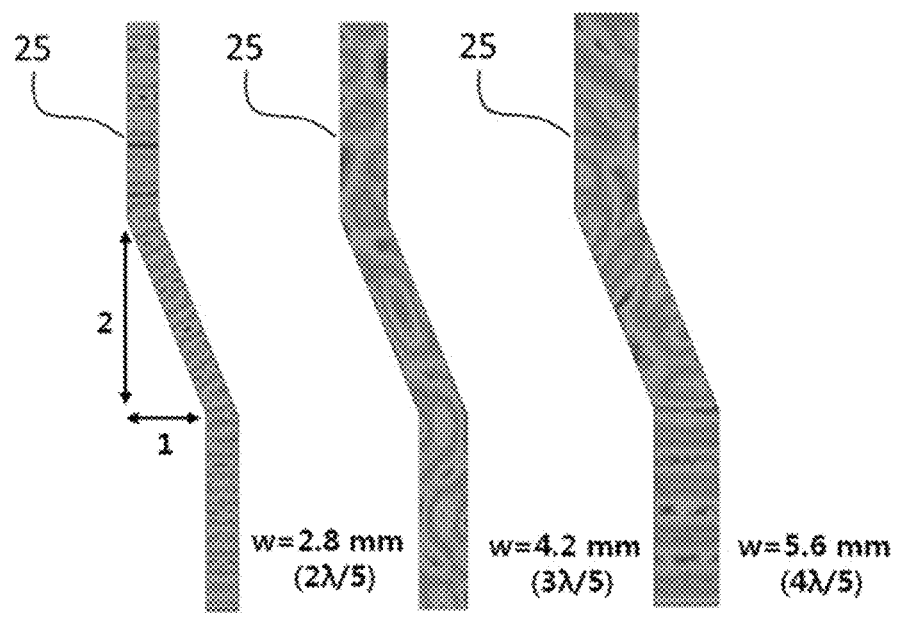

In FIG. 7, channels 25 have the width 2.8 mm (=$2\lambda/5$, $\lambda$=7 mm), 4.2 mm (=$3\lambda/5$, $\lambda$=7 mm), or 5.6 mm (=$4\lambda/5$, $\lambda$=7 mm), respectively. The channel having the width of 2.8 mm, among 2.8 mm, 4.2 mm and 5.6 mm, has uniform electromagnetic distribution. Here, the slope of the channel having the width 2.8 mm has approximately 2/1 slope (2, 1).

Figure 8:
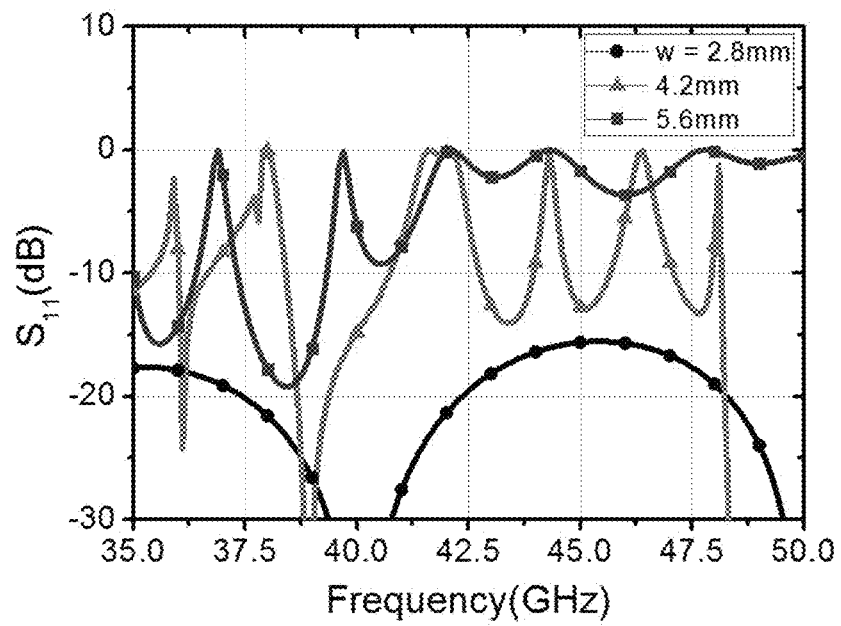

As shown in FIG. 8, a reflected wave ($S_{11}$ (dB)) of the channel 25 having the width of 2.8 mm is comparatively small among the channels 25 having 2.8 mm, 4.2 mm, and 5.6 mm, respectively.

Accordingly, to keep a single mode, it is desirable that the width of the channel 25 is designed to have a length smaller than half wavelength ($\lambda/2$)

Next, design for bent degree of the channel 25 will be described with reference to FIG. 9 and FIG. 10.

Figure 9:
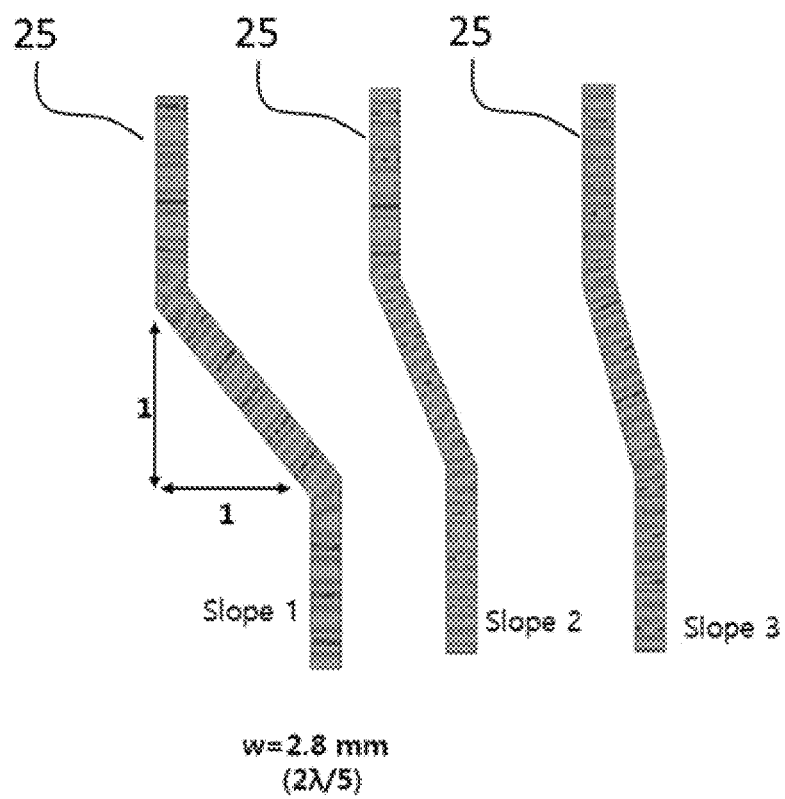

Referring to FIG. 9, a channel 25 having a slope 3, among slope 1, slope 2, and slope 3, has uniform electromagnetic distribution, the slope 3 having a comparatively small slope. Here, the channels 25 having slope 1, slope 2, or slope 3, respectively, have the width w=2.8 mm (=$2\lambda/5$, $\lambda$=7 mm), the slope 1 has approximately 1/1 slope (1, 1), and the slope 3 has approximately ½ slope of the slope 1.

Figure 10:
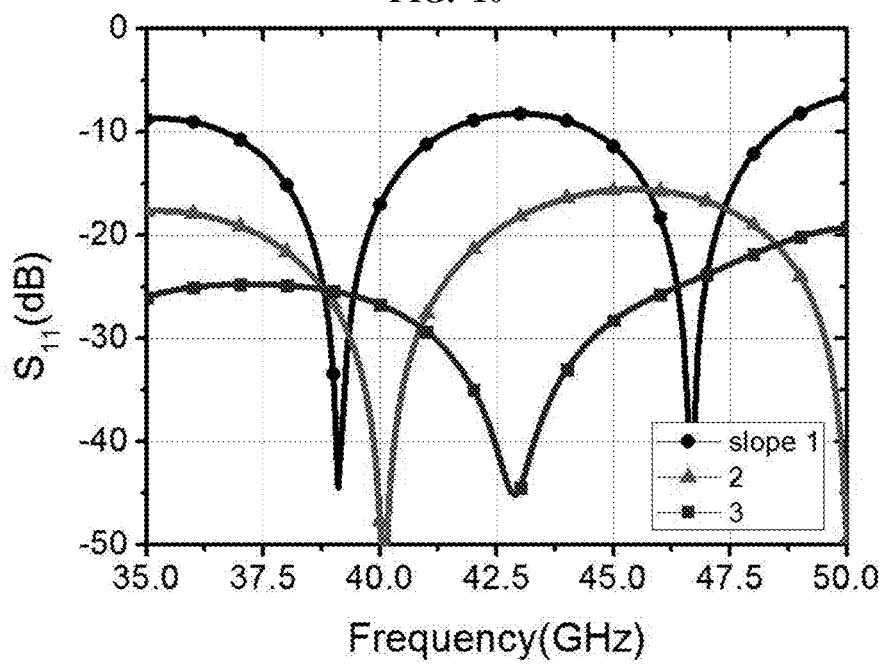

As shown in FIG. 10, a reflected wave ratio ($S_{11}$ dB) of the channel 25 having the slope 3 is comparatively small among the channel 25 having slope 1, slope 2, and slope 3, respectively. Sharp direction change of the channel 25 increases the reflected wave, and thus the channel 25 should be bent in a proper angle.

Accordingly, it is desirable that the bent degree of the channel 25 is designed to have an angle smaller than 30°.

Next, the structure of the division part of the channel 25 will be described with reference to FIG. 11 and FIG. 12.

Figure 11:
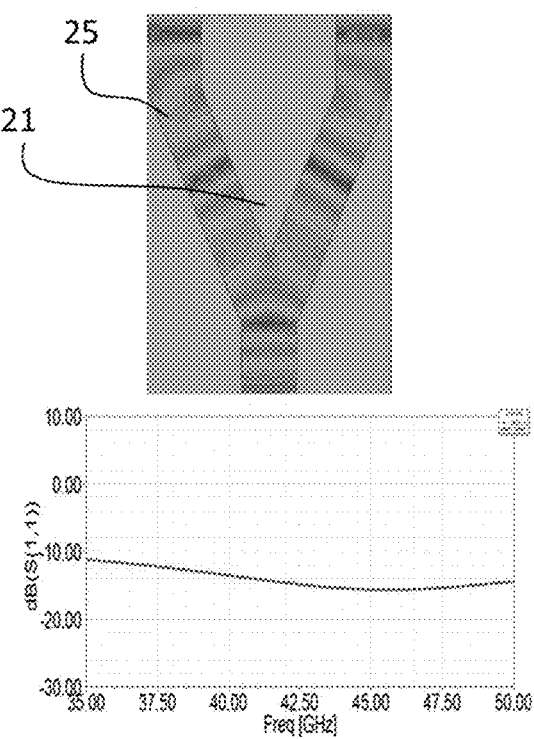
Figure 12:
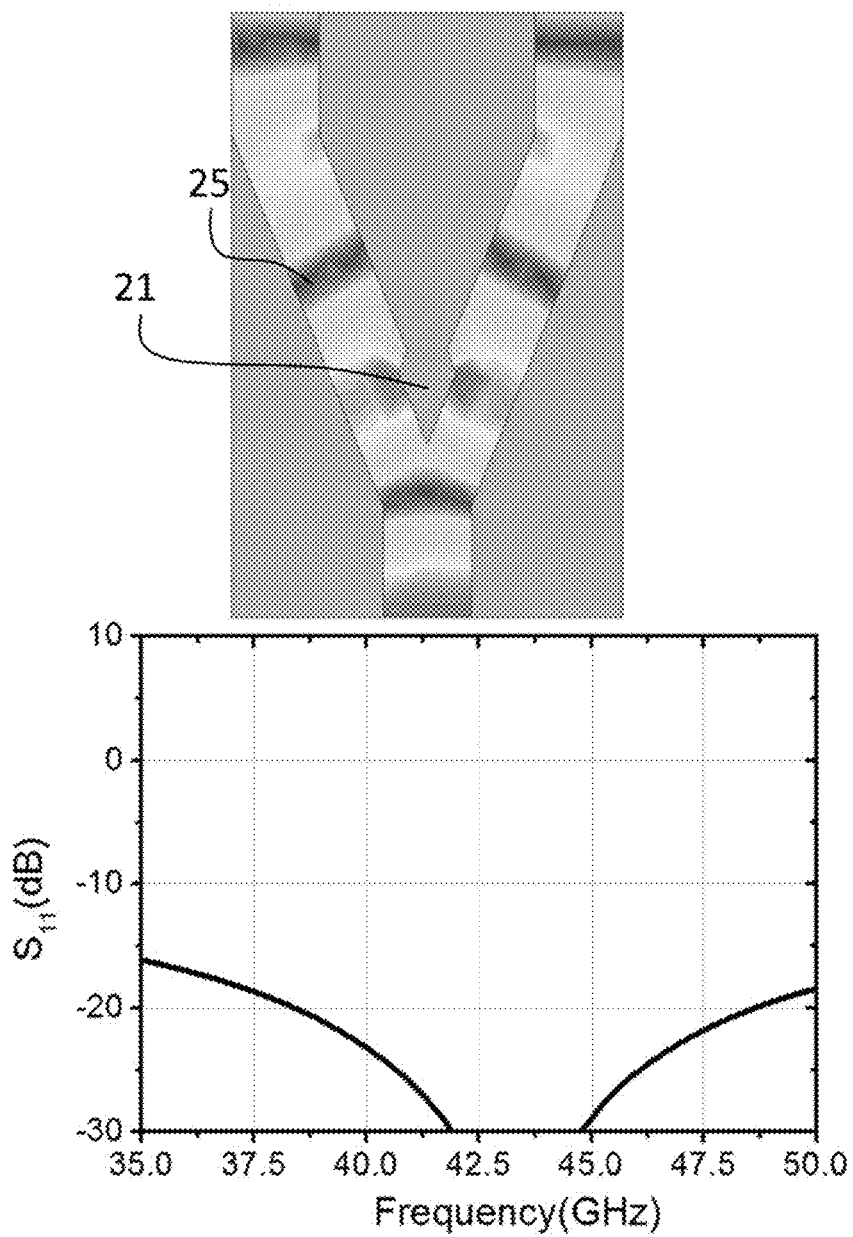

FIG. 11 and FIG. 12 show electromagnetic distribution and intensity of a reflected wave when an edge part of the multilateral pillar 21 located on the division part of the channel 25 has a non-arrowhead structure and an arrowhead structure, respectively.

The division part should be designed to overcome resistance difference occurred by one input channel and two output channels and the reflected wave.

As shown in FIG. 11 and FIG. 12, the division part of the channel 25 has more uniform electromagnetic distribution and smaller reflected wave ratio ($S_{11}$) when the edge part of the multilateral pillar 21 (see also FIGS. 13 and 14) has the arrowhead structure. That is, the division part of the channel 25 has excellent performance when the edge part of the multilateral pillar 21 has the arrowhead structure. However, it is difficult to manufacture in the arrowhead structure.

Next, the inlet structure before the division of the channel 25 will be described with reference to FIG. 13 and FIG. 14.

Figure 13:
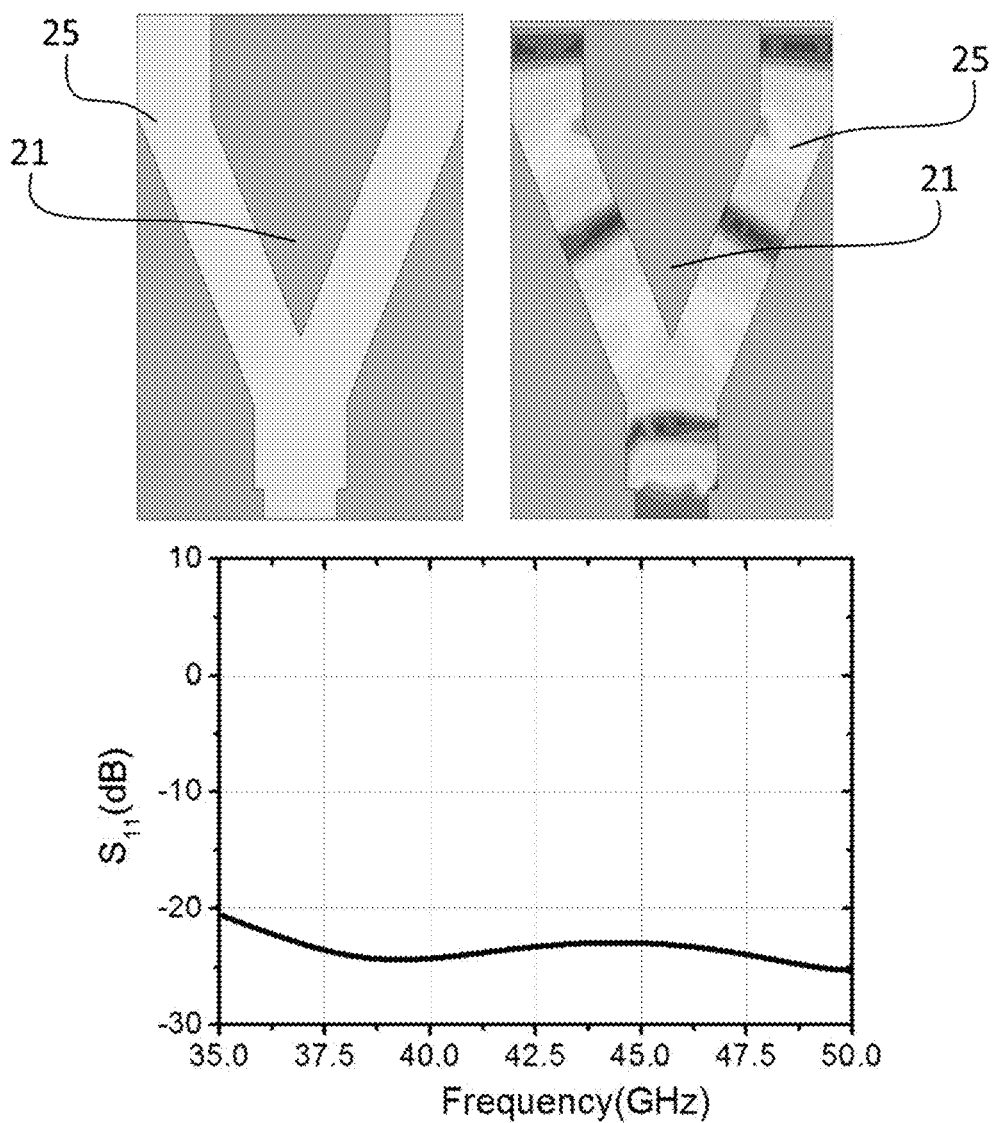

FIG. 13 and FIG. 14 illustrate an electromagnetic distribution and intensity of a reflected wave ratio ($S_{11}$) when the inlet before the division of the channel 25 has a step structure and a taper structure, respectively.

As shown in FIG. 13 and FIG. 14, it is proper to remove the reflected wave in both of the step structure and the taper structure. It may be comparatively easy to manufacture the taper structure.

Next, design for the space of the outlet of the channel 25 will be described with reference to FIG. 15.

Figure 15:
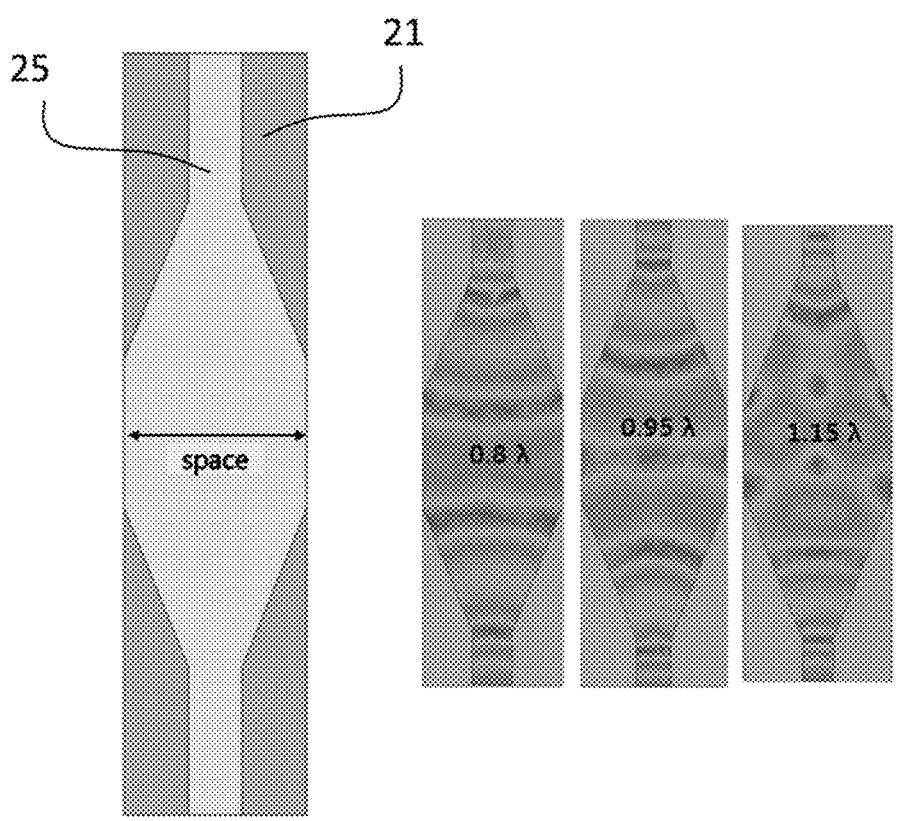

As shown in FIG. 15, multiple modes are generated when the space of the outlet of the channel 25 has a length more than one wavelength (1$\lambda$), such as 1.15$\lambda$.

Accordingly, it is desirable that the space of the outlet of the channel 25 is designed to have a length smaller than the one wavelength, such as 0.8$\lambda$ and 0.95$\lambda$.

As shown in FIG. 3, size, shape and array space of the multilateral pillar 21 arranged on the transition area 20 may be determined according to the above determined width of the channel, bent degree of the channel, structure of the division part of the channel, structure of the inlet before the division of the channel and space of the outlet of the channel.

Figure 16:
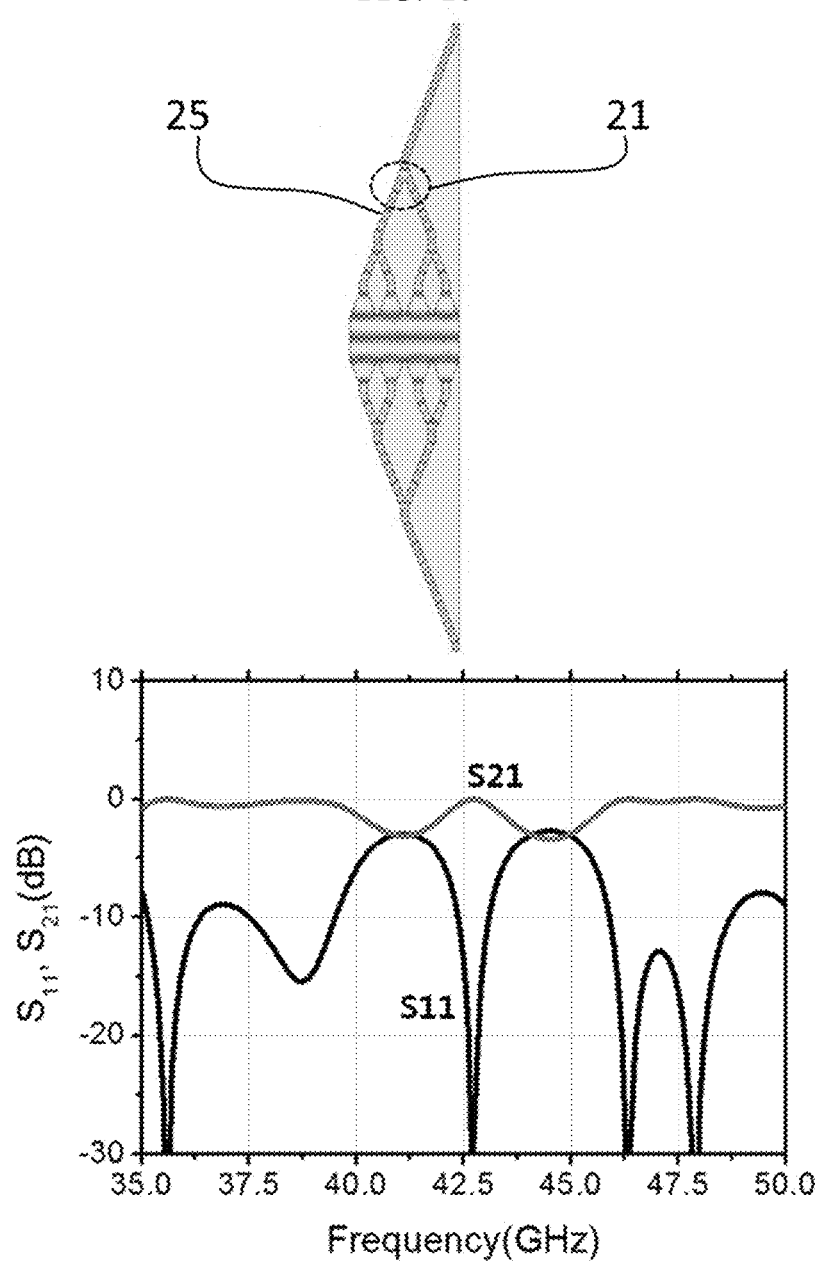

The edge part of the multilateral pillar 21 is formed with the arrowhead structure as shown in FIG. 17 to remove the reflected wave ratio ($S_{11}$) occurred by matching non-revision as shown in FIG. 16, and thus arrowhead matching may be performed about the division part of the channel 25 to obtain a removal effect of the reflected wave ratio ($S_{11}$). Also shown in FIGS. 16 and 17 is the forward wave ratio $S_{21}$ (dB).

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

What is claimed is:

1. An expanded waveguide expanded in a direction of an E-plane to provide uniform electromagnetic field comprising:
    an expanded area expanded in the direction of the E-plane;
    an input transition area and an output transition area connected to both sides of the expanded area and configured to pass an electromagnetic wave; and
    entrance parts formed respectively to an end part of the input transition area and an end part of the output transition area, the electromagnetic wave being inputted and outputted through the respective entrance parts,
    wherein a plurality of multilateral pillars are arranged in constant space in the transition areas, and a channel is divided along between the multilateral pillars to form a plurality of paths in a tree shape,
    wherein the division of the plurality of paths begins from a path at a first entrance part, among the entrance parts, formed to the end part of the input transition area,
    wherein each of the plurality of paths from an inlet of the channel corresponding to the first entrance part to an outlet of the divided channel corresponding to the expanded area has the same length,
    wherein each of the plurality of multilateral pillars is a rectangular pillar having a cross section of rhombus shape, and
    wherein the plurality of multilateral pillars is arranged in different size so that the divided channel forms the tree shape in the input transition area.

2. The expanded waveguide of claim 1, wherein a space of the outlet of the channel is smaller than one wavelength.

3. The expanded waveguide of claim 1, wherein
    the electromagnetic wave inputted through the first entrance part passes through the plurality of paths,
    the electromagnetic wave is divided into a plurality of electromagnetic waves, and
    arrival times of the plurality of electromagnetic waves at the outlet of the divided channel are the same.

4. The expanded waveguide of claim 1, wherein the divided channel has a bend that is an angle smaller than 30°.

5. The expanded waveguide of claim 1, wherein the inlet of the channel has a taper structure.

6. The expanded waveguide of claim 1, wherein a width of the input transition area reduces in the direction from the expanded area to the first entrance part, depending on a width difference between the expanded area and the first entrance part.

7. The expanded waveguide of claim 1, wherein a width of the divided channel is smaller than half wavelength ($\lambda/2$).

8. The expanded waveguide of claim 1, wherein semiconductor elements are installed in a one dimensional array in the expanded area.

9. The expanded waveguide of claim 1, wherein amplifier elements are installed in a one dimensional array in the expanded area to form an amplifier array, and a one dimensional spatial power combining amplifier is formed.

* * * * *